(12) United States Patent
Lu

(10) Patent No.: US 11,036,322 B2
(45) Date of Patent: Jun. 15, 2021

(54) ARRAY SUBSTRATE AND METHOD OF MANUFACTURING SAME

(71) Applicant: WUHAN CHINA STAR OPTOELECTRONICS TECHNOLOGY CO., LTD, Hubei (CN)

(72) Inventor: Yantao Lu, Hubei (CN)

(73) Assignee: WUHAN CHINA STAR OPTOELECTRONICS TECHNOLOGY CO., LTD, Hubei (CN)

(*) Notice: Subject to any disclaimer, the term of this patent is extended or adjusted under 35 U.S.C. 154(b) by 0 days.

(21) Appl. No.: 16/631,175

(22) PCT Filed: Nov. 6, 2019

(86) PCT No.: PCT/CN2019/115927
§ 371 (c)(1),
(2) Date: Jan. 15, 2020

(87) PCT Pub. No.: WO2020/258643
PCT Pub. Date: Dec. 30, 2020

(65) Prior Publication Data
US 2020/0403008 A1    Dec. 24, 2020

(51) Int. Cl.
*G06F 3/041* (2006.01)
*H01L 27/12* (2006.01)
*G02F 1/1333* (2006.01)
*G02F 1/1362* (2006.01)
*G02F 1/1345* (2006.01)
*G02F 1/1368* (2006.01)

(52) U.S. Cl.
CPC ........ *G06F 3/0412* (2013.01); *G02F 1/13338* (2013.01); *G02F 1/13454* (2013.01); *G02F 1/136286* (2013.01); *H01L 27/124* (2013.01); *H01L 27/1218* (2013.01); *H01L 27/1248* (2013.01); *H01L 27/1259* (2013.01); *G02F 1/13685* (2021.01); *G02F 1/136295* (2021.01); *G06F 2203/04103* (2013.01)

(58) Field of Classification Search
CPC ............... H01L 27/124; H01L 27/1259; H01L 27/1248; H01L 27/1218; G06F 3/0412; G06F 2203/04103; G02F 1/13338; G02F 1/136286; G02F 2001/136295
See application file for complete search history.

(56) References Cited

U.S. PATENT DOCUMENTS

| | | | |
|---|---|---|---|
| 9,638,949 B1 * | 5/2017 | Kim | G02F 1/13338 |
| 10,198,104 B2 * | 2/2019 | Xu | G06F 3/041 |
| 10,203,530 B1 * | 2/2019 | Xu | H01L 29/78696 |
| 10,372,247 B2 * | 8/2019 | Zhou | G06F 3/0416 |
| 10,739,918 B2 * | 8/2020 | Won | G06F 3/044 |
| 2002/0008796 A1 * | 1/2002 | Kung | G02F 1/13318 349/42 |

(Continued)

*Primary Examiner* — Chad M Dicke
(74) *Attorney, Agent, or Firm* — Mark M. Friedman

(57) ABSTRACT

An array substrate and a method of manufacturing the same are provided. By setting a gate driver on array (GOA) signal area above a GOA driving circuit area, space occupied by a GOA circuit area is reduced, thereby reducing a frame of a display device, and further increasing a screen ratio of the display device.

7 Claims, 10 Drawing Sheets

(56) References Cited

U.S. PATENT DOCUMENTS

| | | | |
|---|---|---|---|
| 2002/0135722 A1* | 9/2002 | Lee | G02F 1/133711 349/123 |
| 2005/0104508 A1* | 5/2005 | Ozawa | H01L 27/3244 313/500 |
| 2006/0146254 A1* | 7/2006 | Kim | G02F 1/134363 349/141 |
| 2007/0252928 A1* | 11/2007 | Ito | G02F 1/1362 349/106 |
| 2010/0149128 A1* | 6/2010 | No | G02F 1/13338 345/174 |
| 2011/0169747 A1* | 7/2011 | Chen | G06F 3/044 345/173 |
| 2011/0227851 A1* | 9/2011 | Oh | G02F 1/134363 345/173 |
| 2011/0273640 A1* | 11/2011 | Zhang | H01L 27/12 349/43 |
| 2012/0038585 A1* | 2/2012 | Kim | G06F 3/044 345/174 |
| 2012/0162104 A1* | 6/2012 | Chang | G06F 3/0446 345/173 |
| 2013/0077034 A1* | 3/2013 | Jung | G02F 1/13452 349/122 |
| 2014/0160416 A1* | 6/2014 | Wang | G02F 1/134363 349/139 |
| 2014/0299881 A1* | 10/2014 | Oda | H01L 27/124 257/59 |
| 2015/0029116 A1* | 1/2015 | Kim | G06F 3/0416 345/173 |
| 2015/0123112 A1* | 5/2015 | Ro | H01L 27/1248 257/43 |
| 2015/0194443 A1* | 7/2015 | Chen | H01L 27/1248 257/72 |
| 2015/0287751 A1* | 10/2015 | Jin | H01L 27/1255 438/23 |
| 2016/0141312 A1* | 5/2016 | Nakatani | H01L 27/1225 349/43 |
| 2016/0195972 A1* | 7/2016 | Chen | G06F 3/0416 345/173 |
| 2016/0300523 A1* | 10/2016 | Tan | G06F 3/0416 |
| 2016/0328058 A1* | 11/2016 | Peng | H01L 27/1222 |
| 2016/0351093 A1* | 12/2016 | Kim | G09G 3/2092 |
| 2017/0262112 A1* | 9/2017 | Noguchi | G06F 3/0414 |
| 2017/0293189 A1* | 10/2017 | Ren | G02F 1/13439 |
| 2018/0074378 A1* | 3/2018 | Hao | G02F 1/136286 |
| 2018/0076231 A1* | 3/2018 | Yamazaki | H01L 27/1255 |
| 2019/0080133 A1* | 3/2019 | Zhang | G06K 9/0002 |
| 2019/0331975 A1* | 10/2019 | Ko | G02F 1/1368 |

* cited by examiner

US 11,036,322 B2

ARRAY SUBSTRATE AND METHOD OF MANUFACTURING SAME

FIELD OF INVENTION

The present disclosure relates to the field of display technologies, and more particularly to an array substrate and a method of manufacturing the same.

BACKGROUND OF INVENTION

With the rapid development of thin film transistor liquid crystal displays (TFT-LCDs), various manufacturers adopt new technologies to improve the market competitiveness of products and reduce product costs. As a representative of the new technology, Gate driver on array (GOA) technology integrates a gate switching circuit on an array substrate to remove a gate driver integrated circuit portion, thereby saving material and reducing process steps, and this reduces a frame of a display device and reduces product costs.

However, as screen ratios of current touch screen displays continue to increase, frames of which are getting smaller. GOA will also continue to shrink as the frame adjusts its structure. However, under an existing structure, the GOA cannot be reduced due to electrical stability and performance requirements. A GOA circuit area is typically disposed in a non-display area of an array substrate and includes a GOA signal area and a GOA driving circuit area. In an existing array substrate structure, both a GOA signal area and a GOA driving circuit area are disposed adjacent to each other. Limited to this structure, it is difficult for a GOA circuit area to continue to shrink, resulting in difficulty in further reducing a non-display area of a display device. This makes a frame of the display device unable to continue to narrow, and a screen ratio is difficult to continue to increase.

Therefore, it is necessary to provide a new array substrate and a method of manufacturing the same to solve issues existing in the prior art.

SUMMARY OF INVENTION

An object of the present invention is to provide an array substrate and a method of manufacturing the same, which solves issues of the prior art.

In order to achieve the above object, an embodiment of the present invention provides an array substrate and a method of manufacturing the same. The array substrate includes a non-display area and a gate driver on array (GOA) driving circuit area disposed in the non-display area, wherein the GOA driving circuit area comprises a GOA signal area, and the GOA driving circuit area further comprises: a substrate; a buffer layer disposed on the substrate; an active layer disposed on the buffer layer; a gate insulating layer disposed on the active layer; a first metal layer disposed on the gate insulating layer; an interlayer insulating layer disposed on the first metal layer; a second metal layer disposed on the interlayer insulating layer; an organic layer disposed on the second metal layer; a touch metal layer disposed on the organic layer located in the GOA signal area; a first insulating layer disposed on the organic layer and the touch metal layer; and a signal trace disposed on the first insulating layer located in the GOA signal area, wherein the signal trace is connected to the touch metal layer through a first via hole disposed in the first insulating layer and is connected to a thin film transistor layer through a second via hole disposed in the first insulating layer and the organic layer; the second metal layer is further filled in a third via hole penetrating through the interlayer insulating layer and the gate insulating layer and is connected to the active layer, the second metal layer is filled in a fourth via hole disposed in the interlayer insulating layer and is connected to the first metal layer; and the buffer layer comprises a second insulating layer and a third insulating layer stacked with each other.

In an embodiment of the present invention, materials of the first metal layer, the second metal layer, and the touch metal layer are different.

According to another aspect of the present invention, an embodiment of the present invention provides an array substrate. The array substrate comprises a non-display area and a gate driver on array (GOA) driving circuit area disposed in the non-display area, wherein the GOA driving circuit area comprises a GOA signal area, and the GOA driving circuit area further comprises: a substrate; a thin film transistor layer disposed on the substrate; an organic layer disposed on the thin film transistor layer; a touch metal layer disposed on the organic layer located in the GOA signal area; a first insulating layer disposed on the organic layer and the touch metal layer; and a signal trace disposed on the first insulating layer located in the GOA signal area, wherein the signal trace is connected to the touch metal layer through a first via hole disposed in the first insulating layer and is connected to the thin film transistor layer through a second via hole disposed in the first insulating layer and the organic layer.

In an embodiment of the present invention, the thin film transistor layer comprises: a buffer layer disposed on the substrate; an active layer disposed on the buffer layer; a gate insulating layer disposed on the active layer; a first metal layer disposed on the gate insulating layer; an interlayer insulating layer disposed on the first metal layer; and a second metal layer disposed on the interlayer insulating layer.

In an embodiment of the present invention, the second metal layer is further filled in a third via hole penetrating through the interlayer insulating layer and the gate insulating layer and is connected to the active layer, and the second metal layer is filled in a fourth via hole disposed in the interlayer insulating layer and is connected to the first metal layer.

In an embodiment of the present invention, the buffer layer comprises a second insulating layer and a third insulating layer stacked with each other.

In an embodiment of the present invention, materials of the first metal layer, the second metal layer, and the touch metal layer are different.

An embodiment of the present invention further provides a method of manufacturing an array substrate comprising steps of: providing a substrate; forming a thin film transistor layer on the substrate; forming an organic layer on the thin film transistor layer; forming a touch metal layer on the organic layer; forming a first insulating layer on the organic layer and the touch metal layer; patterning the first insulating layer to form a first via hole, patterning the first insulating layer and the organic layer to form a second via hole; and forming a signal trace on the first insulating layer, wherein the signal trace is connected to the touch metal layer through the first via hole and is connected to the thin film transistor layer through the second via hole.

In an embodiment of the present invention, forming the thin film transistor layer on the substrate comprises steps of: forming a buffer layer on the substrate; forming an active layer on the buffer layer; forming a gate insulating layer on the active layer; forming a first metal layer on the gate insulating layer; forming an interlayer insulating layer on the first metal layer; patterning the interlayer insulating layer and the gate insulating layer to form a third via hole, and patterning the interlayer insulating layer to form a fourth via hole; and forming a second metal layer on the interlayer insulating layer.

In an embodiment of the present invention, the second metal layer is further filled in the third via hole penetrating through the interlayer insulating layer and the gate insulating layer and is connected to the active layer, and the second metal layer is filled in the fourth via hole disposed in the interlayer insulating layer and is connected to the first metal layer.

In an embodiment of the present invention, the buffer layer comprises a second insulating layer and a third insulating layer stacked with each other.

In an embodiment of the present invention, materials of the first metal layer, the second metal layer, and the touch metal layer are different.

Beneficial effect of an embodiment of the present invention is that: compared with the prior art, an array substrate and a method of manufacturing the same of the present disclosure reduce space occupied by a GOA circuit area by setting the GOA signal area above the GOA driving circuit area, thereby reducing a frame of a display device. A screen ratio of the display device is further improved. In addition, the materials of the first metal layer, the second metal layer, and the touch metal layer are different, and are located on different horizontal planes, thereby effectively preventing signal transmission quality issues caused by interference between metal layers. Furthermore, the touch metal layer in the GOA signal area is used to implement a touch function, and the touch function of the display device is not affected while the frame is reduced.

DETAILED DESCRIPTION OF PREFERRED EMBODIMENTS

The following description of the various embodiments is provided to illustrate the specific embodiments.

An array substrate 1 and a method of manufacturing the same according to an embodiment of the present invention are described below with reference to FIG. 1 to FIG. 5.

Figure 1:
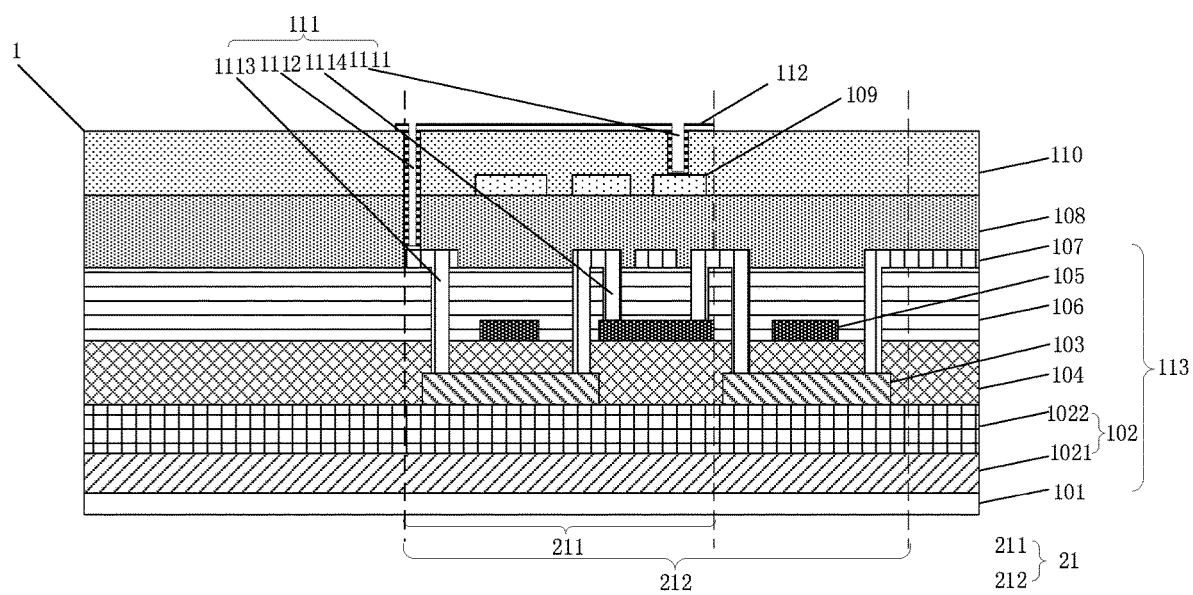
FIG. 1 is a schematic structural view of an array substrate according to an embodiment of the present invention.

An embodiment of the present invention provides an array substrate 1 having a structure as shown in FIG. 1. The array substrate 1 includes a gate driver on array (GOA) circuit area 21, and the GOA circuit area 21 is divided into a GOA signal area 211 and a GOA driving circuit area 212. The GOA signal area 211 is disposed in the GOA driving circuit area 212 and is located directly above the GOA driving circuit area 212. The GOA driving circuit area 212 includes a substrate 101, a buffer layer 102, an active layer 103, a gate insulating layer 104, a first metal layer 105, an interlayer insulating layer 106, a second metal layer 107, an organic layer 108, a touch metal layer 109, a first insulating layer 110, a via hole 111, and a signal trace 112. The GOA signal area 211 includes the organic layer 108, the touch metal layer 109, the first insulating layer 110, the via hole 111, and the signal trace 112.

A substrate 101 serves as a bottom of the array substrate 1. The substrate 101 is, for example but not limited to, a glass substrate.

The buffer layer 102 is disposed on the substrate 101. The buffer layer 102 includes a second insulating layer 1021 and a third insulating layer 1022 which are stacked. In the embodiment, the second insulating layer 1021 is disposed on the substrate 101 to cover an upper surface of the substrate 101. The third insulating layer 1022 is disposed on the second insulating layer 1021 to cover an upper surface of the second insulating layer 1021. Material of the buffer layer 102 includes one or a combination of two of silicon nitride (SiNx) and silicon oxide (SiOx). In this embodiment, material of the second insulating layer 1021 includes silicon oxide, and material of the third insulating layer 1022 includes silicon nitride.

The active layer 103 is disposed on the buffer layer 102. In the embodiment, the active layer is patterned to form the active layer 103 shown in FIG. 1. Specifically, the active layer 103 is disposed on the upper surface of the buffer layer 102.

The gate insulating layer 104 is disposed on the active layer 103. In the embodiment, the gate insulating layer 104 covers an upper surface of the active layer 103 and a portion of the upper surface of the buffer layer 102 that is not covered by the active layer 103.

The first metal layer 105 is disposed on the gate insulating layer 104. In the embodiment, the first metal layer is patterned to form the first metal layer 105 shown in FIG. 1. Specifically, the first metal layer 105 is disposed on an upper surface of the gate insulating layer 104. In the embodiment, material of the first metal layer 105 includes molybdenum. Of course, in other partial embodiments, the material of the first metal layer 105 includes, but is not limited to, molybdenum.

The interlayer insulating layer 106 is disposed on the first metal layer 105. In the embodiment, the interlayer insulating layer 106 covers an upper surface of the first metal layer 105 and a portion of an upper surface of the gate insulating layer 104 that is not covered by the first metal layer 105.

The via hole 111 includes a first via hole 1111, a second via hole 1112, a third via hole 1113, and a fourth via hole 1114. The second metal layer 107 is connected to the active layer 103 by the third via hole 1113 that sequentially penetrates the interlayer insulating layer 106 and the gate insulating layer 104. The second metal layer 107 is connected to the first metal layer 105 by the fourth via hole 1114 penetrating the interlayer insulating layer 106.

The second metal layer 107 is disposed on the interlayer insulating layer 106. In the embodiment, the second metal layer is filled in the third via hole 1113 penetrating the interlayer insulating layer 106 and the gate insulating layer 104 and is connected to the active layer 103. In addition, the second metal layer is filled in the fourth via 1114 of the interlayer insulating layer 106 and is connected to the first metal layer 105. Thereafter, the second metal layer is patterned to form the second metal layer 107 shown in FIG. 1. In this embodiment, the second metal layer 107 may be a laminated structure, for example, a three-layer structure, specifically, a titanium (Ti) film layer, an aluminum (Al) film layer, and a titanium (Ti) film layer, wherein the aluminum film layer serves as an intermediate layer and is sandwiched by the outer titanium film layer.

The buffer layer 102, the active layer 103, the gate insulating layer 104, the first metal layer 105, the interlayer insulating layer 106, and the second metal layer 107 described above collectively constitute a thin film transistor layer 113 in this embodiment.

The organic layer 108 is disposed on the thin film transistor layer 113, that is, on the second metal layer 107. In the embodiment, the organic layer 108 covers an upper surface of the second metal layer 107 and a portion of an upper surface of the interlayer insulating layer 106 that is not covered by the second metal layer 107. In the embodiment, the organic layer 108 acts as a flat layer to make alignment more uniform while reducing coupling capacitance.

The touch metal layer 109 is disposed on the organic layer 108 located in the GOA signal area 211. In the embodiment, the touch metal layer 109 is spaced apart from an upper surface of the organic layer 108. The touch metal layer 109 integrates a touch function. In this embodiment, the touch metal layer 109 is a laminated structure, for example, a three-layer structure including a molybdenum film layer, an aluminum film layer, and a molybdenum film layer, wherein the aluminum film layer acts as an intermediate layer and is sandwiched by the outer molybdenum film layer. Materials of the first metal layer 105, the second metal layer 107, and the touch metal layer 109 are all different, and the three are not on the same horizontal plane, thereby effectively preventing signal transmission quality issues caused by interference between metal layers.

The first insulating layer 110 is disposed on the touch metal layer 109. In the embodiment, the first insulating layer 110 covers an upper surface of the touch metal layer 109 and a portion of an upper surface of the organic layer 108 that is not covered by the touch metal layer 109. The material of the first insulating layer 110 includes one or a combination of two of silicon nitride and silicon oxide. In the embodiment, the first insulating layer 110 includes silicon nitride, and the first insulating layer 110 serves as a passivation layer for isolating water and oxygen, and prolonging a working life of the array substrate 1.

The signal trace 112 is disposed on the first insulating layer 110 located in the GOA signal area 211 and is disposed above the GOA driving circuit area 212. In this embodiment, the signal trace 112 is connected to the touch metal layer 109 through the first via hole 1111 disposed in the first insulating layer 110, and is connected to the thin film transistor layer 113 through the second via hole 1112 disposed in the first insulating layer 110 and the organic layer 108. Specifically, the signal trace 112 is further connected to the second metal layer 107. Such a structure reduces space occupied by the entire GOA circuit area 21 while achieving successful connection of the GOA signal area 211 and the GOA drive circuit area 212. Material of the signal trace 112 includes, but are not limited to, indium tin oxide (ITO).

Figure 2:
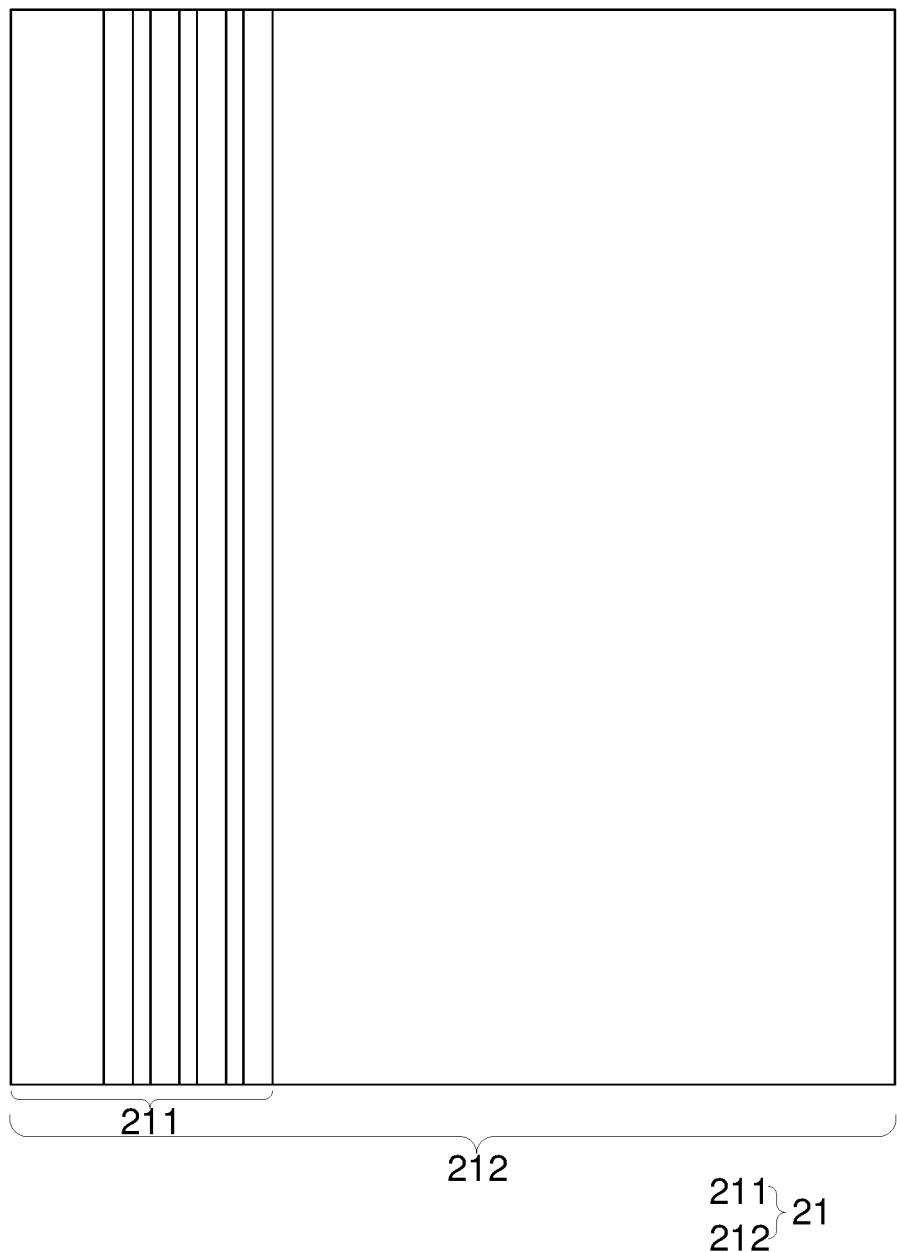
FIG. 2 is a schematic structural view of another perspective view of the array substrate in FIG. 1.

As shown in FIG. 2, in this view, the GOA signal area 211 is included by the GOA driving circuit area 212. Space occupied by the GOA signal area 211 and the GOA driving circuit area 212 is reduced, thereby reducing space occupied by the entire GOA circuit area 21, which is advantageous for further reducing a frame and increasing a screen ratio.

Figure 3:
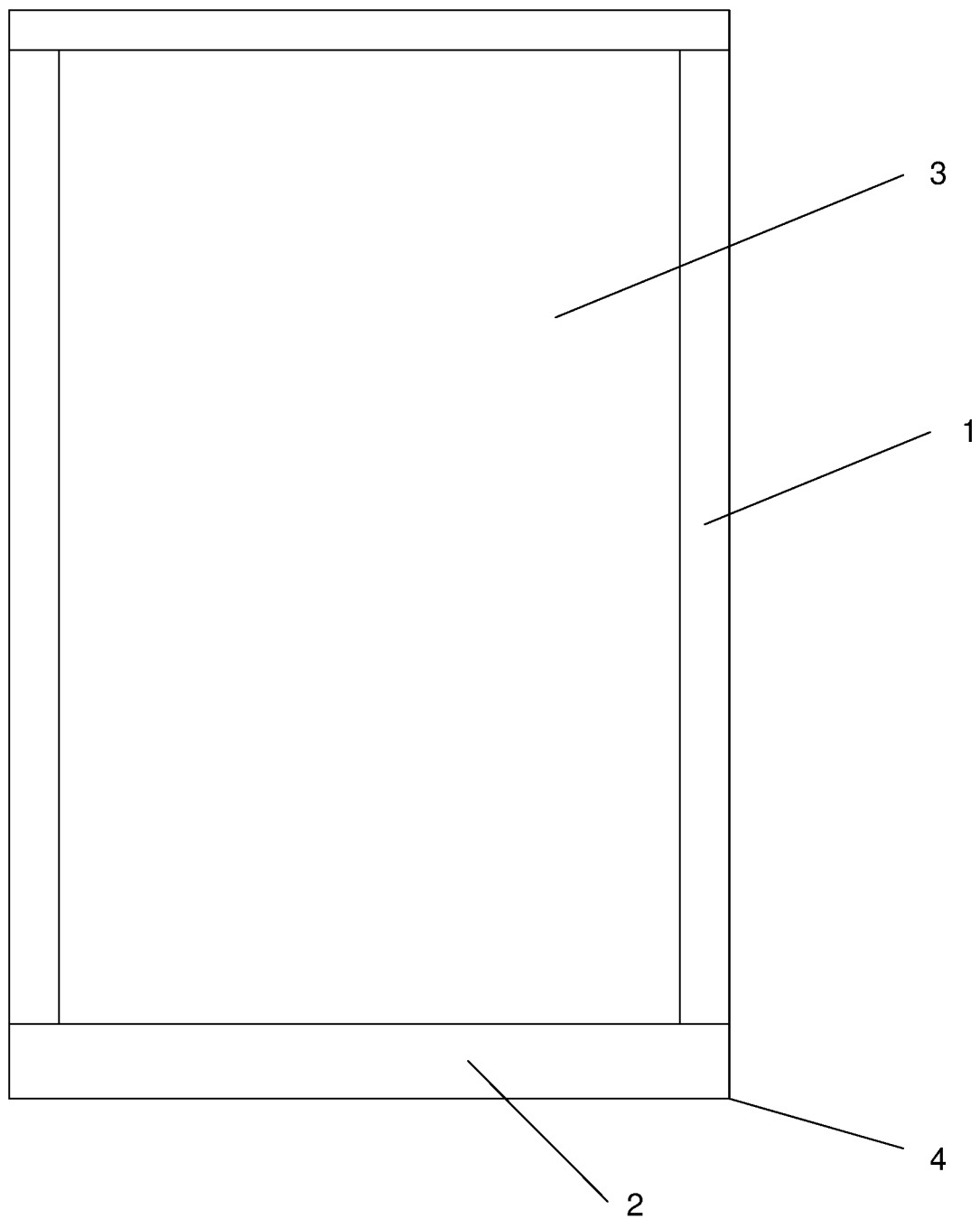
FIG. 3 is a schematic structural view of a display device according to an embodiment of the present invention.

The array substrate 1 of an embodiment of the present invention can be applied to a display device 4. Specifically, as shown in FIG. 3, the display device 4 includes a display area 3 and a non-display area 2. In the embodiment, the GOA circuit area 21 in the array substrate 1 is disposed in the non-display area 2. The GOA circuit area 21 includes the GOA signal area 211 and the GOA driving circuit area 212 described above. The GOA signal area 211 may be disposed at an edge where the display area 3 and the non-display area 2 meet. Since the GOA signal area 211 is provided with the touch metal layer 109 integrated with touch function, a frame of the display device 4 is further reduced without affecting the touch function.

Figure 4:
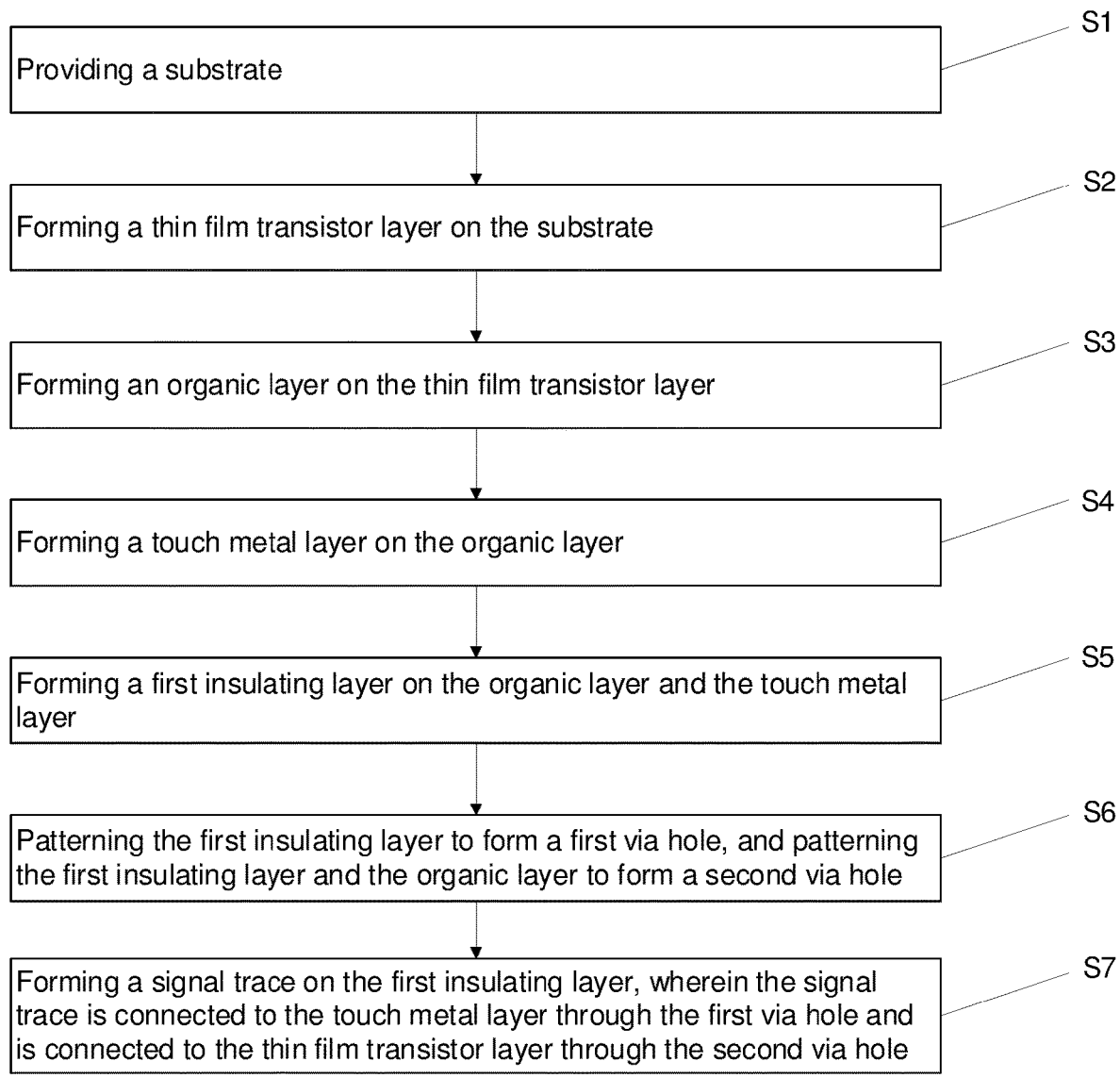
FIG. 4 is a schematic flowchart showing a method of manufacturing an array substrate according to an embodiment of the invention.
Figure 5:
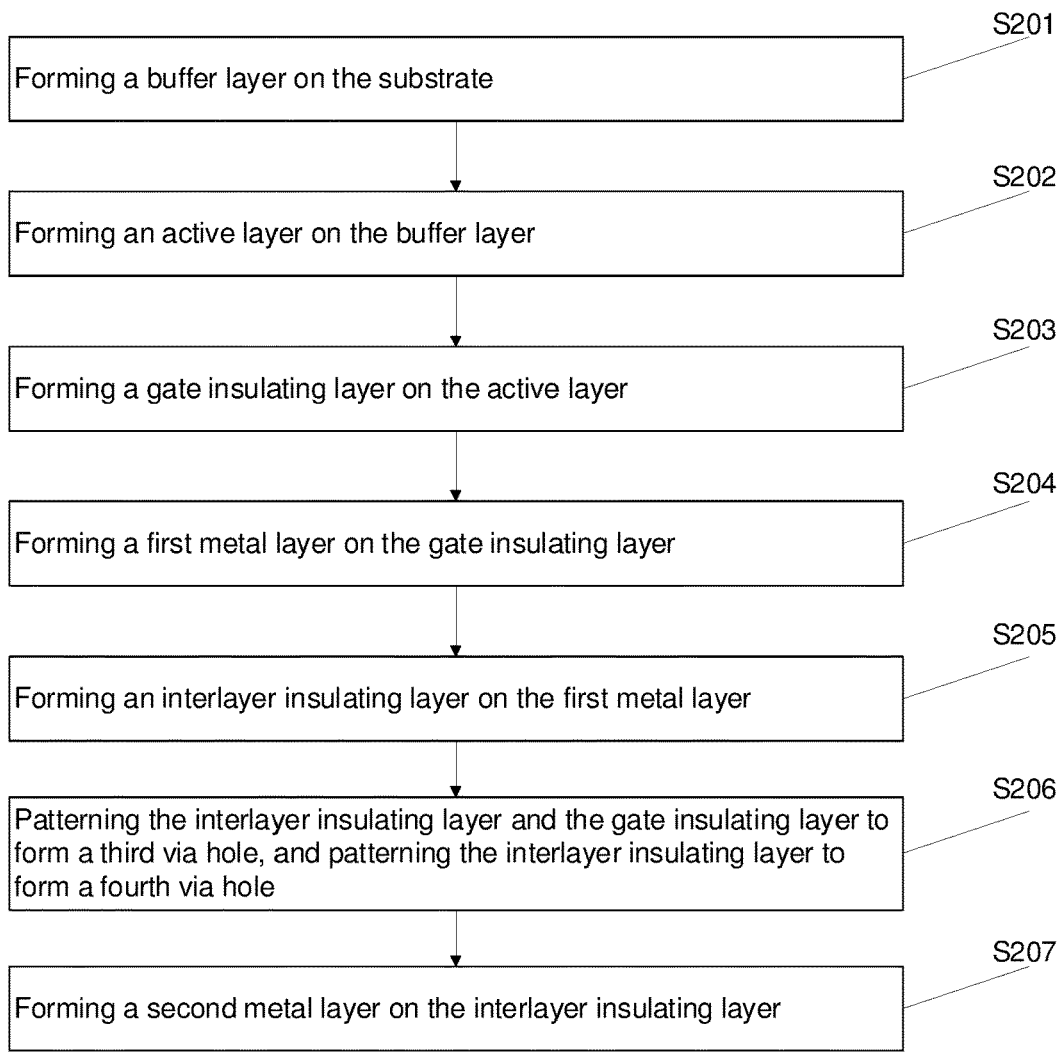
FIG. 5 is a schematic flowchart showing steps of forming a thin film transistor layer in FIG. 4.

An embodiment of the present invention also provides a method of manufacturing the array substrate 1. As shown in FIG. 4, a specific structure of the array substrate 1 is as described above, and details are not described herein again.

The method includes the following steps:

Step S1, providing a substrate 101.

Figure 6:
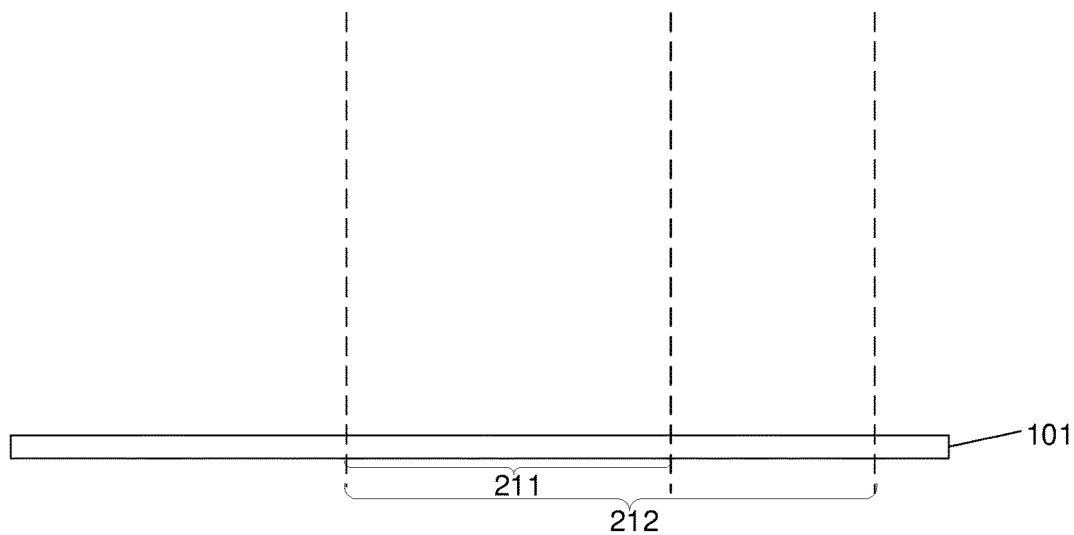
FIG. 6 to FIG. 18 are schematic structural views corresponding to a method for manufacturing an array substrate according to an embodiment of the present invention.

Referring to FIG. 6, the substrate 101 is provided as a bottom of the array substrate 1. The substrate 101 is, for example but not limited to, a glass substrate.

Step S2, forming a thin film transistor layer 113 on the substrate 101.

In this embodiment, step S2 further includes the following steps:

Step S201, forming a buffer layer 102 on the substrate 101.

Figure 7:
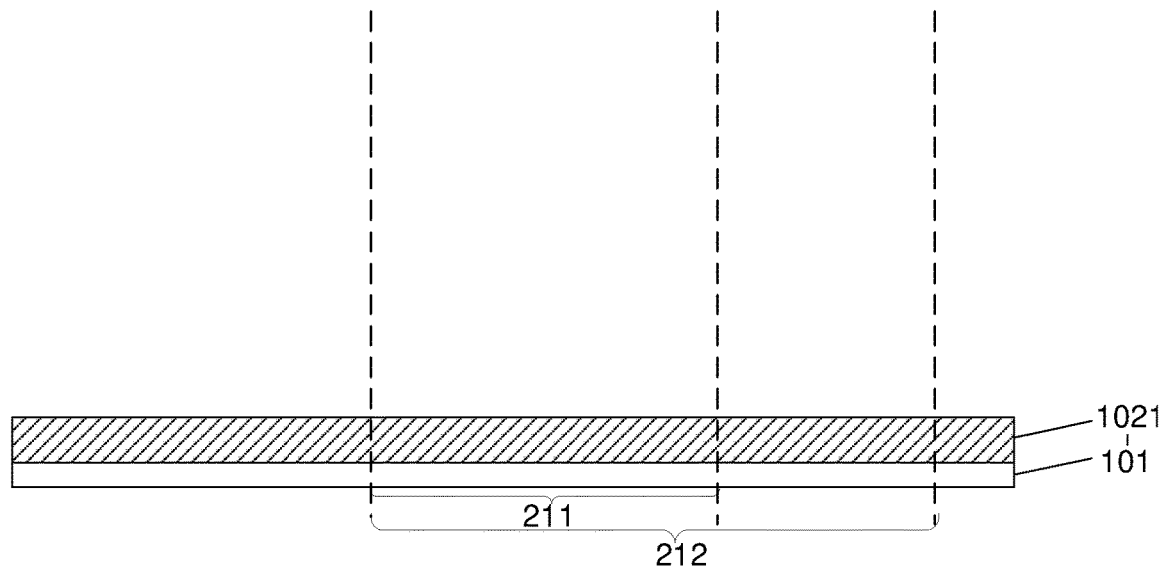

The buffer layer 102 includes a second insulating layer 1021 and a third insulating layer 1022 which are stacked. Referring to FIG. 7, the second insulating layer 102 is formed on the substrate 101 to cover an upper surface of the substrate 101.

Figure 8:
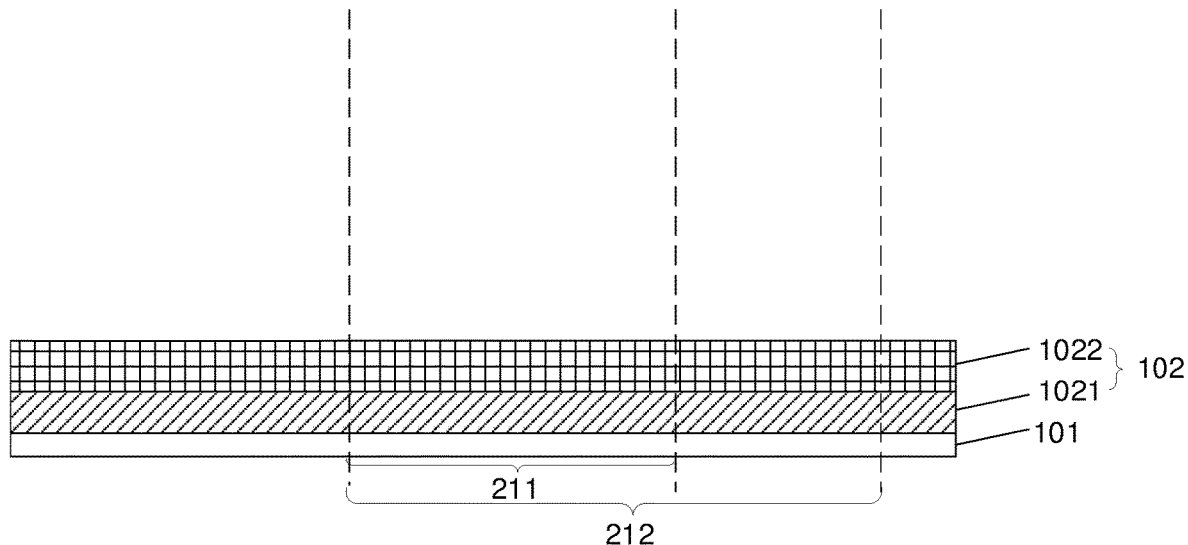

Referring to FIG. 8, a third insulating layer 1022 is formed on the second insulating layer 1021 to cover an upper surface of the second insulating layer 1021. Material of the buffer layer 102 includes one or a combination of two of silicon nitride (SiNx) and silicon oxide (SiOx). In this embodiment, material of the second insulating layer 1021 includes silicon oxide, and material of the third insulating layer 1022 includes silicon nitride.

Step S202, forming an active layer 103 on the buffer layer 102.

Figure 9:
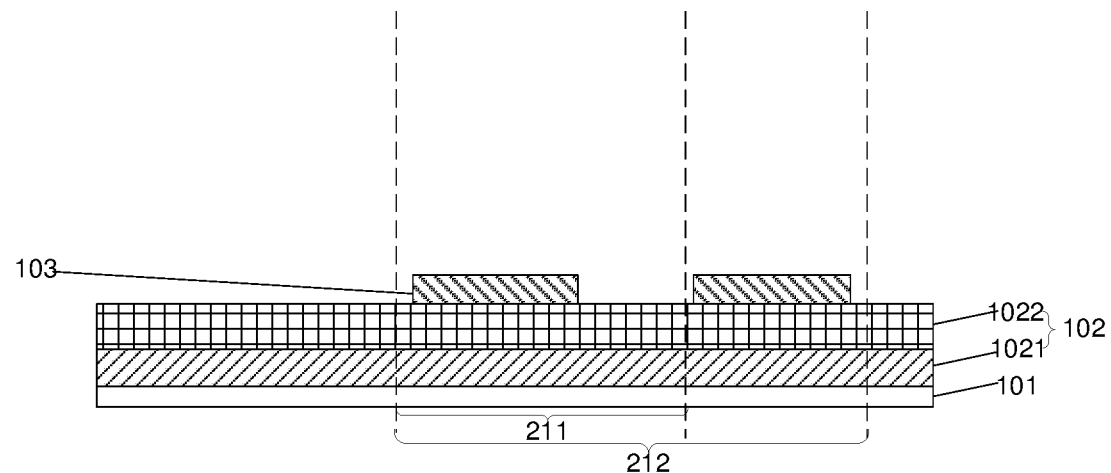

Referring to FIG. 9, the active layer 103 is formed on the buffer layer 102. In the embodiment, the active layer is patterned to form the active layer 103 shown in FIG. 9. Specifically, the active layer 103 is formed on an upper surface of the buffer layer 102.

Step S203, forming a gate insulating layer 104 on the active layer 103.

Figure 10:
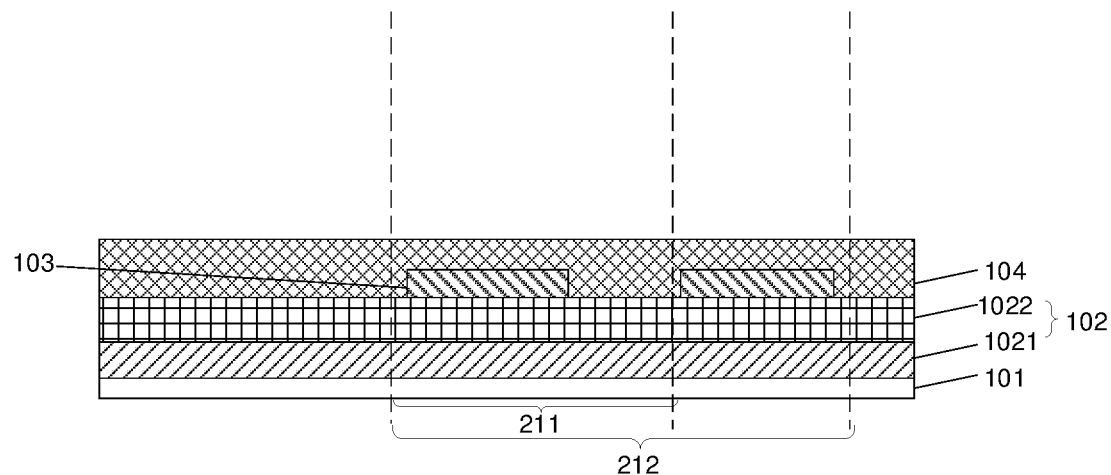

Referring to FIG. 10, the gate insulating layer 104 is formed on the active layer 103. In the embodiment, the gate insulating layer 104 covers an upper surface of the active layer 103 and a portion of an upper surface of the buffer layer 102 that is not covered by the active layer 103.

Step S204, forming a first metal layer 105 on the gate insulating layer 104.

Figure 11:
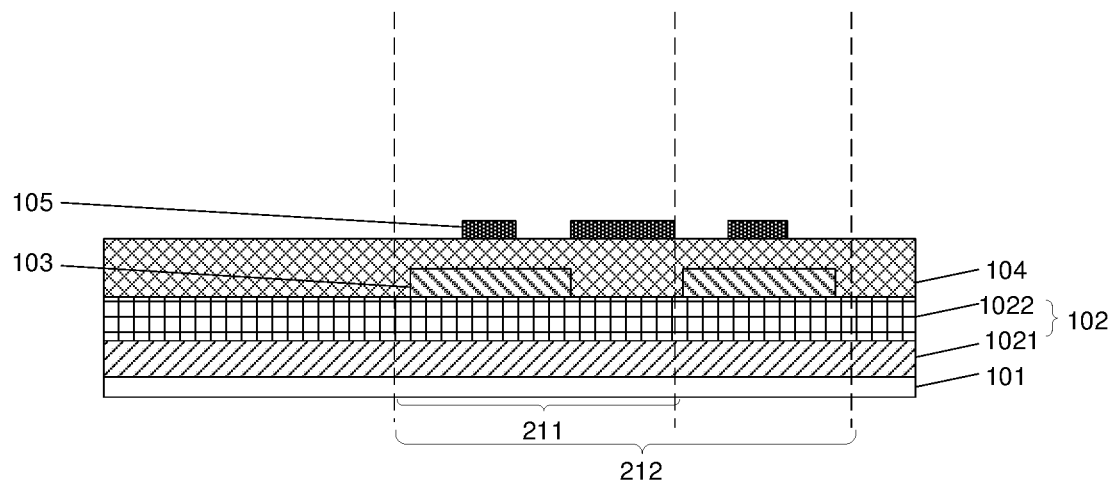

Referring to FIG. 11, the first metal layer 105 is formed on the gate insulating layer 104. In the embodiment, the first metal layer is patterned to form the first metal layer 105 shown in FIG. 11. Specifically, the first metal layer 105 is formed on an upper surface of the gate insulating layer 104.

Step S205, forming an interlayer insulating layer 106 on the first metal layer 105.

Figure 12:
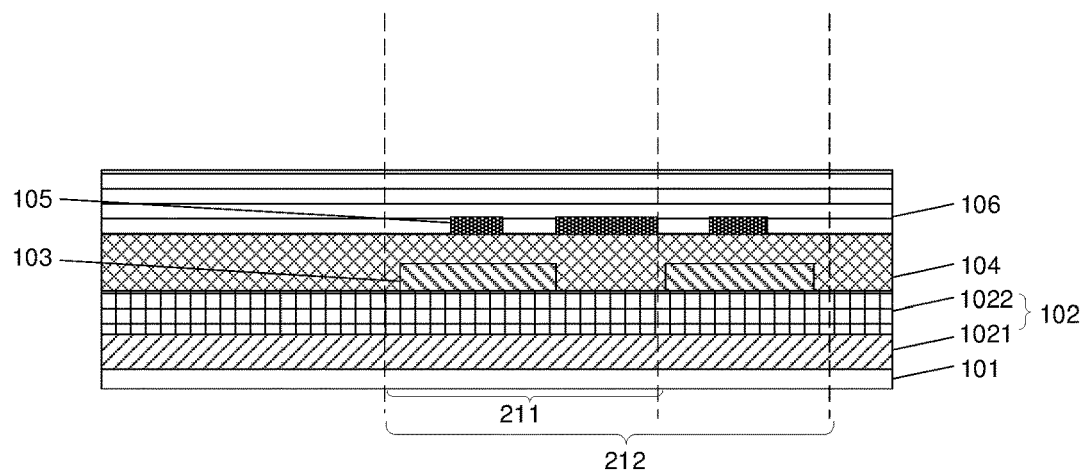

Referring to FIG. 12, the interlayer insulating layer 106 is formed on the first metal layer 105. In the embodiment, the interlayer insulating layer 106 covers an upper surface of the first metal layer 105 and a portion of an upper surface of the gate insulating layer 104 that is not covered by the first metal layer 105.

Step S206, patterning the interlayer insulating layer 106 and the gate insulating layer 104 to form a third via hole 1113, and patterning the interlayer insulating layer 106 to form a fourth via hole 1114.

Figure 13:
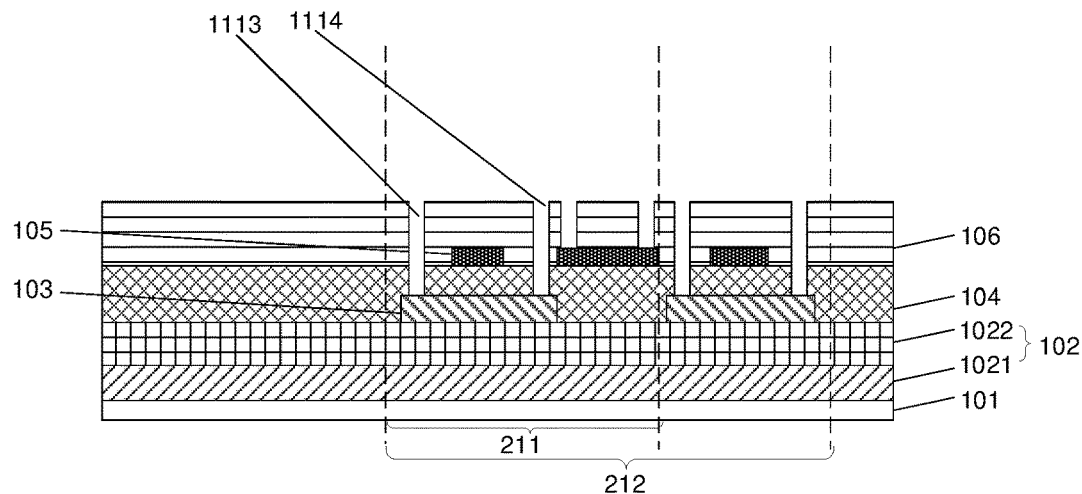

The interlayer insulating layer 106 and the gate insulating layer 104 are patterned to form the third via hole 1113. The interlayer insulating layer 106 is then patterned to form the fourth via hole 1114. Referring to FIG. 13, the third via hole 1113 penetrates the interlayer insulating layer 106 and the gate insulating layer 104 in order from top to bottom and is connected to the upper surface of the active layer 103. The fourth via hole 1114 penetrates the interlayer insulating layer 106 and is connected to the upper surface of the first metal layer 105.

Step S207, forming a second metal layer 107 on the interlayer insulating layer 106.

Figure 14:
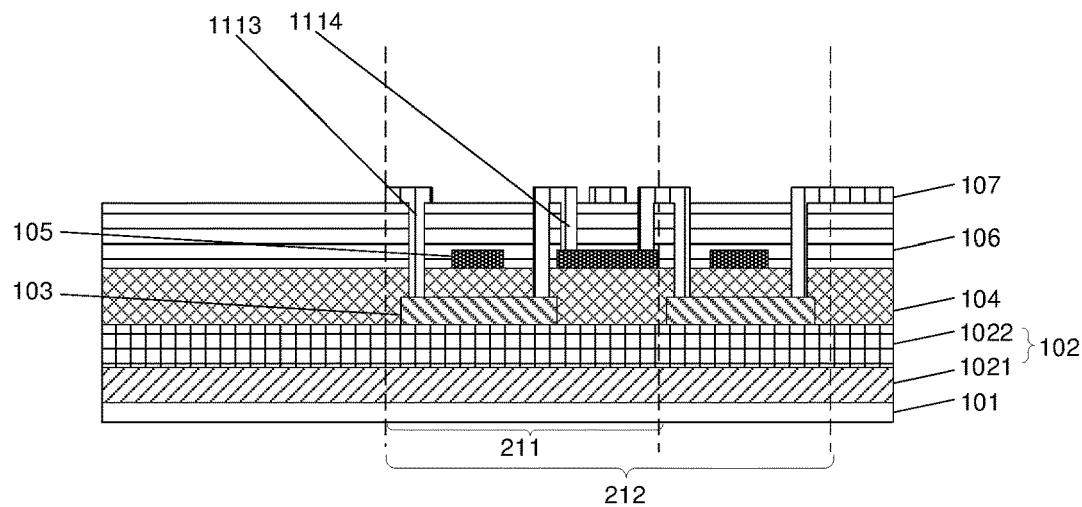

Referring to FIG. 14, in this step, the second metal layer 107 is deposited on the interlayer insulating layer. Because the third via hole 1113 and the fourth via hole 1114 have been formed before operation of depositing the second metal layer, a portion of the second metal layer 107 is filled in the third via hole 1113 and the fourth via hole 1114 when the second metal layer 107 is deposited. Next, the second metal layer is patterned to form the second metal layer 107 as shown in FIG. 14.

In this embodiment, the second metal layer 107 may be a laminated structure, for example, a three-layer structure, specifically, a titanium (Ti) film layer, an aluminum (Al) film layer, and a titanium (Ti) film layer, wherein the aluminum film layer serves as an intermediate layer and is sandwiched by the outer titanium film layer.

Step S3, forming an organic layer 108 on the thin film transistor layer 113.

Figure 15:
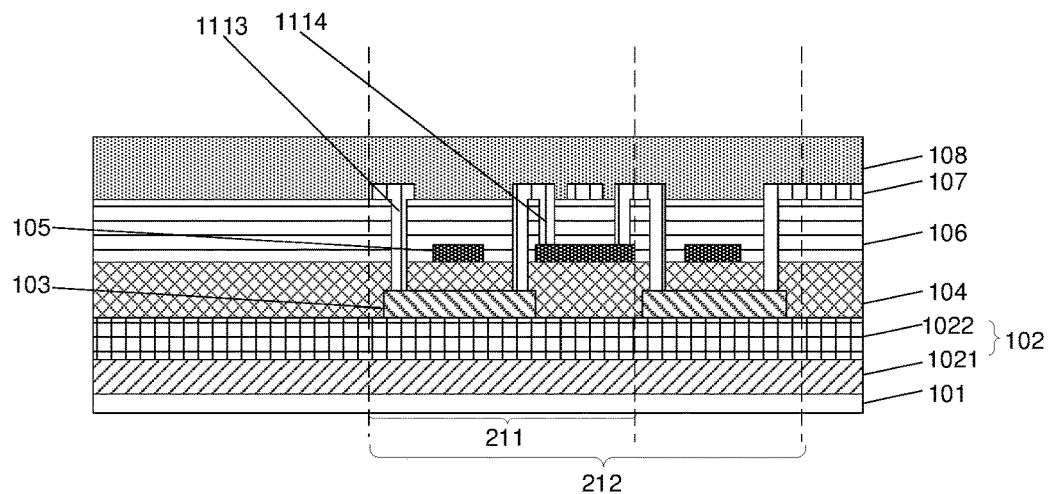

Referring to FIG. 15, the organic layer 108 is formed on the thin film transistor layer 113. Specifically, the organic layer 108 is further disposed on the second metal layer 107. In the embodiment, the organic layer 108 covers an upper surface of the second metal layer 107 and a portion of an upper surface of the interlayer insulating layer 106 that is not covered by the second metal layer 107. In the embodiment, the organic layer 108 acts as a flat layer to make alignment more uniform. In addition, coupling capacitance is reduced.

Step S4, forming a touch metal layer 109 on the organic layer 108.

Figure 16:
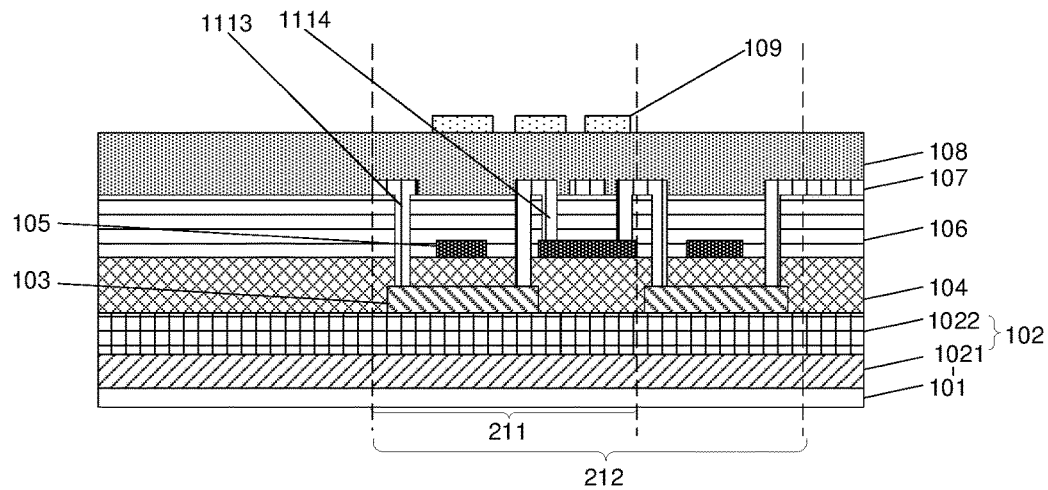

Referring to FIG. 16, the touch metal layer 109 is formed on the organic layer 108 located in the GOA signal area 211. In the embodiment, the touch metal layer 109 is spaced apart from an upper surface of the organic layer 108. The touch metal layer 109 integrates a touch function. In this embodiment, the touch metal layer 109 is a laminated structure, for example, a three-layer structure including a molybdenum film layer, an aluminum film layer, and a molybdenum film layer, wherein the aluminum film layer acts as an intermediate layer and is sandwiched by the outer molybdenum film layer. Materials of the first metal layer 105, the second metal layer 107, and the touch metal layer 109 are all different, and the three are not on the same horizontal plane, thereby effectively preventing signal transmission quality issues caused by interference between metal layers.

Step S5, forming a first insulating layer 110 on the organic layer 108 and the touch metal layer 109.

Figure 17:
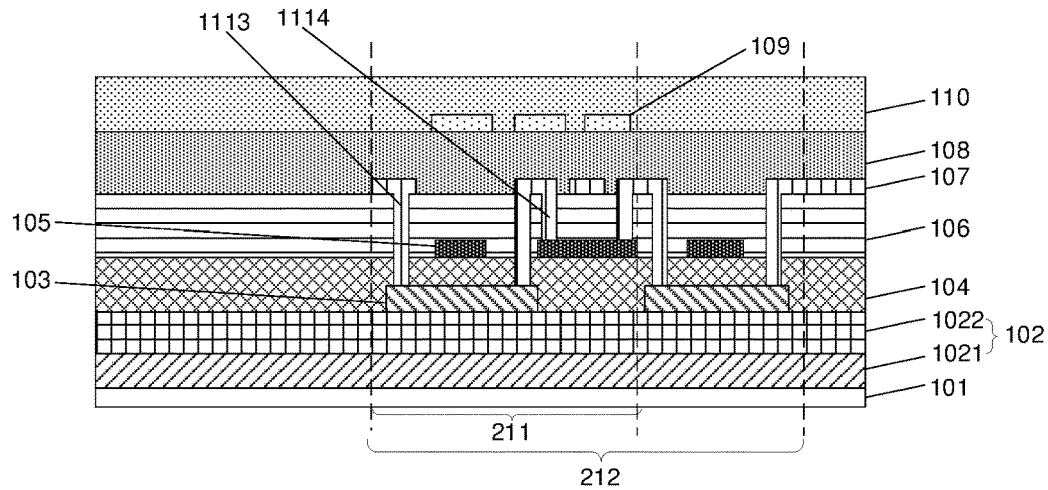

Referring to FIG. 17, the first insulating layer 110 is formed on the organic layer 108 and the touch metal layer 109. In the embodiment, the first insulating layer 110 covers an upper surface of the touch metal layer 109 and a portion of an upper surface of the organic layer 108 that is not covered by the touch metal layer 109. Material of the first insulating layer 110 includes one or a combination of two of silicon nitride and silicon oxide. In the embodiment, the first insulating layer 110 includes silicon nitride, and the first insulating layer 110 serves as a passivation layer for isolating water and oxygen, and prolonging a working life of the array substrate 1.

Step S6, patterning the first insulating layer 110 to form a first via hole 1111, and patterning the first insulating layer 110 and the organic layer 108 to form a second via hole 1112.

Figure 18:
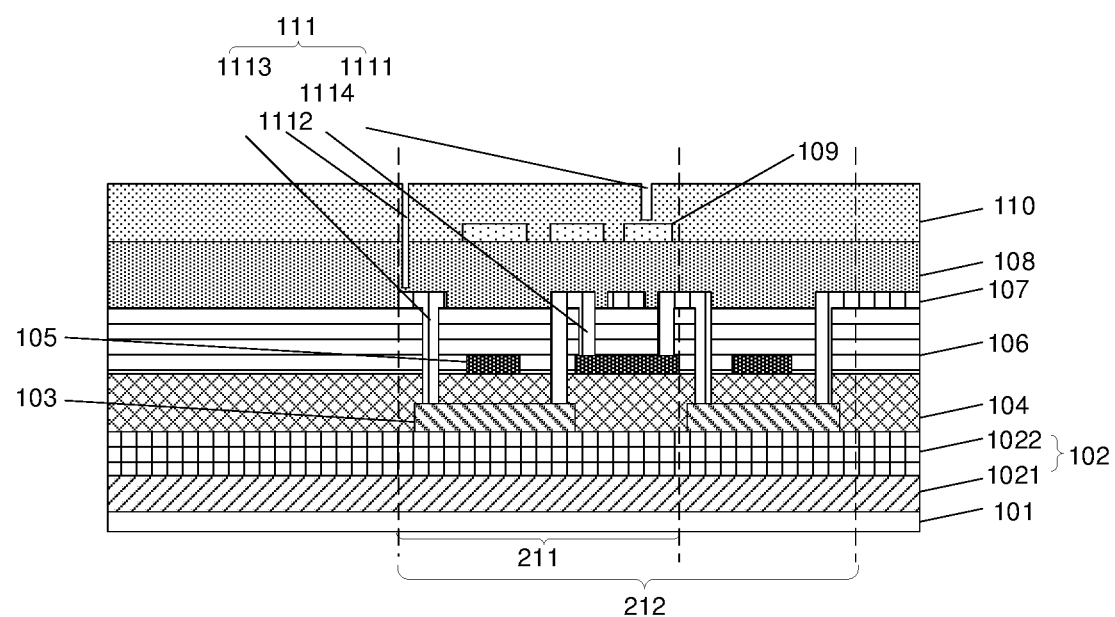

The first insulating layer 110 is patterned to form the first via hole 1111. The first insulating layer 110 and the organic layer 108 are then patterned to form the second via hole 1112. Referring to FIG. 18, the second via hole 1112 penetrates the first insulating layer 110 and the organic layer 108 in order from top to bottom and is connected to the upper surface of the second metal layer 107. The first via hole 1111 penetrates through the first insulating layer 110 and is connected to the upper surface of the touch metal layer 109.

Step S7, forming a signal trace 112 on the first insulating layer 110, wherein the signal trace 112 is connected to the touch metal layer 109 through the first via hole 1111 and is connected to the thin film transistor layer 113 through the second via hole 1112.

Referring to FIG. 1, the signal trace 112 is disposed on the first insulating layer 110 located in the GOA signal area 211 and is disposed above the GOA driving circuit area 212. In this embodiment, after the first via hole 1111 and the second via hole 1112 are formed, the signal trace 112 is connected to the touch metal layer 109 through the first via hole 1111 disposed in the first insulating layer 110, and is connected to the thin film transistor layer 113 through the second via hole 1112 disposed in the first insulating layer 110 and the organic layer 108. Specifically, the signal trace 112 is further connected to the second metal layer 107. Such a structure reduces space occupied by the entire GOA circuit area 21 while achieving successful connection of the GOA signal area 211 and the GOA drive circuit area 212. Material of the signal trace 112 includes, but are not limited to, indium tin oxide (ITO).

Beneficial effect of an embodiment of the present invention is that: an array substrate and a method of manufacturing the same of the present disclosure reduce space occupied by a GOA circuit area by setting the GOA signal area above the GOA driving circuit area, thereby reducing a frame of a display device. A screen ratio of the display device is further improved. In addition, the materials of the first metal layer, the second metal layer, and the touch metal layer are different, and are located on different horizontal planes, thereby effectively preventing signal transmission quality issues caused by interference between metal layers. Furthermore, the touch metal layer in the GOA signal area is used to implement a touch function, and the touch function of the display device is not affected while the frame is reduced.

The above is only a preferred embodiment of the present invention. It should be noted that many modifications and refinements can be made by those skilled in the art without departing from the principles of the present invention. These modifications and refinements should also be considered as the protection scope of the present invention.

The subject matter of the present application can be manufactured and used in the industry with industrial applicability.

What is claimed is:

1. An array substrate, comprising:
a non-display area and a gate driver on array (GOA) driving circuit area disposed in the non-display area, wherein the GOA driving circuit area comprises a GOA signal area, and the GOA driving circuit area further comprises:
a substrate;
a buffer layer disposed on the substrate;
an active layer disposed on the buffer layer;
a gate insulating layer disposed on the active layer;
a first metal layer disposed on the gate insulating layer;
an interlayer insulating layer disposed on the first metal layer;
a second metal layer disposed on the interlayer insulating layer;
an organic layer disposed on the second metal layer;
a touch metal layer disposed on the organic layer located in the GOA signal area;
a first insulating layer disposed on the organic layer and the touch metal layer; and
a signal trace disposed on the first insulating layer located in the GOA signal area, wherein the signal trace is connected to the touch metal layer through a first via hole disposed in the first insulating layer and is connected to a thin film transistor layer through a second via hole disposed in the first insulating layer and the organic layer; the second metal layer is further filled in a third via hole penetrating through the interlayer insulating layer and the gate insulating layer and is connected to the active layer, the second metal layer is filled in a fourth via hole disposed in the interlayer insulating layer and is connected to the first metal layer; and the buffer layer comprises a second insulating layer and a third insulating layer stacked with each other;
wherein materials of the first metal layer, the second metal layer, and the touch metal layer are different, the touch metal layer is spaced apart from an upper surface of the organic layer, the touch metal layer is a three-layer structure comprising a first molybdenum film layer, an aluminum film layer, and a second molybdenum film layer, and the signal trace bridges signals on the touch metal layer to the first metal layer and the second metal layer.

2. An array substrate, comprising:
a non-display area and a gate driver on array (GOA) driving circuit area disposed in the non-display area, wherein the GOA driving circuit area comprises a GOA signal area, and the GOA driving circuit area further comprises:
a substrate;
a thin film transistor layer disposed on the substrate;
an organic layer disposed on the thin film transistor layer;
a touch metal layer disposed on the organic layer located in the GOA signal area;
a first insulating layer disposed on the organic layer and the touch metal layer; and
a signal trace disposed on the first insulating layer located in the GOA signal area, wherein the signal trace is connected to the touch metal layer through a first via hole disposed in the first insulating layer and is connected to the thin film transistor layer through a second via hole disposed in the first insulating layer and the organic layer;
wherein the thin film transistor layer comprises:
a buffer layer disposed on the substrate;
an active layer disposed on the buffer layer;
a gate insulating layer disposed on the active layer;
a first metal layer disposed on the gate insulating layer;
an interlayer insulating layer disposed on the first metal layer; and
a second metal layer disposed on the interlayer insulating layer;
wherein materials of the first metal layer, the second metal layer, and the touch metal layer are different, the touch metal layer is spaced apart from an upper surface of the organic layer, the touch metal layer is a three-layer structure comprising a first molybdenum film layer, an aluminum film layer, and a second molybdenum film layer, and the signal trace bridges signals on the touch metal layer to the first metal layer and the second metal layer.

3. The array substrate according to claim 2, wherein the second metal layer is further filled in a third via hole penetrating through the interlayer insulating layer and the gate insulating layer and is connected to the active layer, and the second metal layer is filled in a fourth via hole disposed in the interlayer insulating layer and is connected to the first metal layer.

4. The array substrate according to claim 2, wherein the buffer layer comprises a second insulating layer and a third insulating layer stacked with each other.

5. A method of manufacturing an array substrate, comprising steps of:
providing a substrate;
forming a thin film transistor layer on the substrate;
forming an organic layer on the thin film transistor layer;
forming a touch metal layer on the organic layer;
forming a first insulating layer on the organic layer and the touch metal layer;
patterning the first insulating layer to form a first via hole, patterning the first insulating layer and the organic layer to form a second via hole; and
forming a signal trace on the first insulating layer, wherein the signal trace is connected to the touch metal layer through the first via hole and is connected to the thin film transistor layer through the second via hole;
wherein forming the thin film transistor layer on the substrate comprises steps of:
forming a buffer layer on the substrate;
forming an active layer on the buffer layer;
forming a gate insulating layer on the active layer;
forming a first metal layer on the gate insulating layer;
forming an interlayer insulating layer on the first metal layer;
patterning the interlayer insulating layer and the gate insulating layer to form a third via hole, and patterning the interlayer insulating layer to form a fourth via hole; and
forming a second metal layer on the interlayer insulating layer;
wherein materials of the first metal layer, the second metal layer, and the touch metal layer are different, the touch metal layer is spaced apart from an upper surface of the organic layer, the touch metal layer is a three-layer structure comprising a first molybdenum film layer, an aluminum film layer, and a second molybdenum film layer, and the signal trace bridges signals on the touch metal layer to the first metal layer and the second metal layer.

6. The method of manufacturing the array substrate according to claim 5, wherein the second metal layer is further filled in the third via hole penetrating through the interlayer insulating layer and the gate insulating layer and is connected to the active layer, and the second metal layer is filled in the fourth via hole disposed in the interlayer insulating layer and is connected to the first metal layer.

7. The method of manufacturing the array substrate according to claim 5, wherein the buffer layer comprises a second insulating layer and a third insulating layer stacked with each other.

* * * * *